US008644047B2

United States Patent
Onda et al.

(10) Patent No.: US 8,644,047 B2
(45) Date of Patent: Feb. 4, 2014

(54) SEMICONDUCTOR DEVICE HAVING DATA BUS

(76) Inventors: Takamitsu Onda, Tokyo (JP); Hisayuki Nagamine, Tokyo (JP)

( * ) Notice: Subject to any disclaimer, the term of this patent is extended or adjusted under 35 U.S.C. 154(b) by 15 days.

(21) Appl. No.: 13/303,506

(22) Filed: Nov. 23, 2011

(65) Prior Publication Data

US 2012/0127773 A1  May 24, 2012

(30) Foreign Application Priority Data

Nov. 24, 2010  (JP) .................................. 2010-261431

(51) Int. Cl.
G11C 7/02 (2006.01)

(52) U.S. Cl.
USPC .......................................................... 365/53

(58) Field of Classification Search
None
See application file for complete search history.

(56) References Cited

U.S. PATENT DOCUMENTS

| 4,112,512 | A  | * | 9/1978  | Arzubi et al. ................. 365/149 |
| 6,643,168 | B2 | * | 11/2003 | Okazawa ....................... 365/173 |
| 7,350,167 | B1 | * | 3/2008  | Lenahan ........................ 716/115 |
| 7,923,809 | B2 |   | 4/2011  | Onda et al. |
| 2002/0033489 | A1 | * | 3/2002 | Kobayashi .................... 257/202 |
| 2005/0017360 | A1 | * | 1/2005 | Hirano et al. ................. 257/756 |

FOREIGN PATENT DOCUMENTS

JP  2009-231513  10/2009

* cited by examiner

Primary Examiner — Hoai V Ho
Assistant Examiner — James G Norman
(74) Attorney, Agent, or Firm — Young & Thompson

(57) ABSTRACT

A semiconductor device is disclosed which comprises a first wiring layer, a second wiring layer formed over the first wiring layer, data input/output terminals, and a data bus formed in the first and second wiring layers. The data bus includes N data lines transmitting data between a predetermined circuit and the input/output terminals. M first data lines among the N data lines have a length shorter than a predetermined length and residual N-M second data lines have a length longer than the predetermined length. Shield lines adjacent to the N data lines are formed in the first and second layers. The N data lines are arranged at positions at which the data lines do not overlap one another in a stacking direction of the first and second wiring layers.

15 Claims, 20 Drawing Sheets

SEMICONDUCTOR DEVICE HAVING DATA BUS

BACKGROUND OF THE INVENTION

1. Field of the Invention

The present invention relates to a semiconductor device comprising a data bus including data lines transmitting data, and a plurality of data input/output terminals for inputting/outputting transmission data of the data bus from/to outside.

2. Description of Related Art

In recent years, increases in capacity and speed have been achieved in semiconductor devices such as DRAM (Dynamic Random Access Memory) that are capable of storing data in a plurality of memory cells, and thus a configuration is required in which transmission data can be transferred with high speed from/to outside through a data bus arranged in a high density. For example, assuming a configuration shown in later-described FIGS. 1 to 4 as a general configuration of the DRAM, data read out from a memory cell is transmitted to a data bus DB1 through an internal circuit, and is transmitted from the data bus DB1 to DQ pads in synchronization with a high-speed clock so as to be outputted to outside. Since the DQ pads are arranged in a manner as shown in a later-described DQ region R4 of FIG. 6 (DQ pads 0 to 15), for example, there are data lines extending from the data bus DB1 to a plurality of DQ pads. In this case, if high-speed data transfer is performed in a state where a plurality of data lines are arranged close to one another, there is a possibility that transmission quality may be deteriorated due to noise or the like caused by coupling between adjacent data lines. Therefore, wiring structures for improving the transmission quality of the plurality of data lines arranged in parallel have been conventionally proposed (for example, refer to Patent Reference 1)

[Patent Reference 1] Japanese Patent Application Laid-open No. 2009-231513 (U.S. Pat. No. 7,923,809)

FIG. 17 shows a general structural example for arranging the plurality of data lines of the data bus DB1, which is a cross-sectional structural view showing a portion near a left end of a DQ region R4 (FIG. 1) of the data bus DB1. That is, a plurality of data lines D of the data bus DB1 having the same width are arranged in parallel with the same spacing in an upper wiring layer M2, and a coupling capacitance Cc exists between adjacent two data lines. Meanwhile, lines having a wide width that are connected to power supplies or the like are arranged in a lower wiring layer M1 for a countermeasure against noise. However, it is difficult to sufficiently suppress the coupling capacitance Cc only by this countermeasure.

Here, a problem associated with the high-speed data transfer through the data bus DB1 will be described using FIGS. 18A and 18B. FIG. 18A shows a transmission circuit by which the data bus DB1 is modeled. FIG. 18B shows a waveform of an input signal A, a waveform of a transmission signal B, and waveforms of an output signal C, regarding a focused line at the center in FIG. 18A. The input signal A is subject to crosstalk affected by the coupling capacitance Cc from adjacent two lines on both sides, which results in that the waveform of the transmission signal B is rounded off. At this point, the lines of the data bus DB1 operate at the same timing, and their levels (HIGH/LOW) randomly change. Therefore, following three states of the adjacent lines on both sides can be considered:

(State-1) both adjacent lines change with the same phase as the focused line.

(State-2) One of the adjacent lines change with the same phase as the focused line, and the other thereof changes with an opposite phase to the focused line.

(State-3) Both adjacent lines change with the opposite phase to the focused line. Thereby, the transmission waveform B behaves differently in accordance with the above three states. That is, timings at which the transmission waveform B rises to HIGH include three timings t1, t2 and t3 corresponding to the state-1, state-2 and state-3, respectively, as shown in an enlarged part on the right side of FIG. 18B. As a result, different delays Δt occur in the waveforms of the output signal C in accordance with the three states, as shown on the lower side of FIG. 18B. Assuming that this phenomenon occurs, a circuit that receives data from the focused line needs to be designed to permit that the timings of the states are deviated from one another. However, designing in such a manner is difficult to achieve under an environment of high-speed operations as fast as clocks. Therefore, it is desirable to reduce the coupling capacitance Cc between adjacent data lines of the data bus DB1 by other measures. A first measure for reducing the coupling capacitance Cc between adjacent data lines of the data bus DB1 is to widen a gap between the data lines D based on the structure of FIG. 17. By widening the gap in this manner, the coupling capacitance Cc of FIG. 17 becomes small, but a lager layout area is required corresponding to widening the gap. Therefore, an increase in chip size is brought about, and a sufficient suppression effect of the crosstalk cannot be obtained. FIG. 19 is a structural diagram for explaining a second measure for reducing the coupling capacitance Cc between adjacent data lines of the data bus DB1. As shown in FIG. 19, by arranging shield lines S between respective adjacent data lines D, it is possible to sufficiently reduce the coupling capacitance Cc so as to suppress the crosstalk. However, in the second measure, when the number of data lines D and the arrangement gap therebetween are assumed to be the same as those in FIG. 17, the total number of lines simply doubles by adding the shield lines S, and thus an increase in chip size is inevitable. FIG. 20 is a structural diagram for explaining a third measure between the first and second measures. As shown in FIG. 20, the shield lines S are arranged in both sides of each pair of adjacent data lines D. Thereby, the suppression effect of the crosstalk can be larger than the first measure, and the layout area can be smaller than the second measure. However, a larger layout area is required in comparison with FIG. 17, and thus an increase in chip size is also brought about in this case.

In this manner, when achieving a wiring structure of the data bus used in the high-speed data transmission in the conventional semiconductor device, it has been difficult to achieve a design that satisfies both requirements of excellent transmission performance and prevention of an increase in chip size.

SUMMARY

A semiconductor device according to one embodiment of the disclosure comprises: a first wiring layer; a second wiring layer formed over the first wiring layer; a plurality of data input/output terminals inputting/outputting data; a data bus formed in the first and second wiring layers, the data bus including N (N is an integer greater than 1) data lines through which data is transmitted between a predetermined circuit and the plurality of data input/output terminals, the N data lines comprising M (M is an integer satisfying M<N) first data lines and remaining N-M second data lines, each of the M first data lines having a length shorter than a predetermined length, each of the N-M second data lines having a length longer than the predetermined length; a plurality of shield lines each being adjacent to each of the N data lines formed in the first and second layers; and the N data lines arranged at positions at which the data lines do not overlap one another in a stacking direction of the first and second wiring layers.

In the semiconductor device according to one embodiment, the data bus through which data is transmitted to/from the plurality of data input/output terminals is formed by N data lines including two kinds of data lines having different lengths. Then, the N data lines are arranged in the first and second wiring layers, shield lines are adjacent to each data line, and the data lines do not overlap one another in the stacking direction. This wiring structure enables to reliably reduce coupling capacitance between the data lines including the first data lines with a short length and the second data lines with a long length, by appropriately setting size conditions thereof including widths of the lines and gaps between adjacent lines. In this case, by securing gaps between data lines facing each other obliquely in the stacking direction, and thus coupling capacitance therebetween can be effectively reduced, in addition to the coupling capacitance between the data lines in the same wiring layer. Therefore, it is possible to suppress influence of crosstalk of the data bus so as to improve transmission quality without enlarging the layout area of the data bus.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

Preferred embodiments will be described in detail below with reference to accompanying drawings. The following embodiments disclose a DRAM (Dynamic Random Access Memory) as an example of the semiconductor device.

Figure 1:
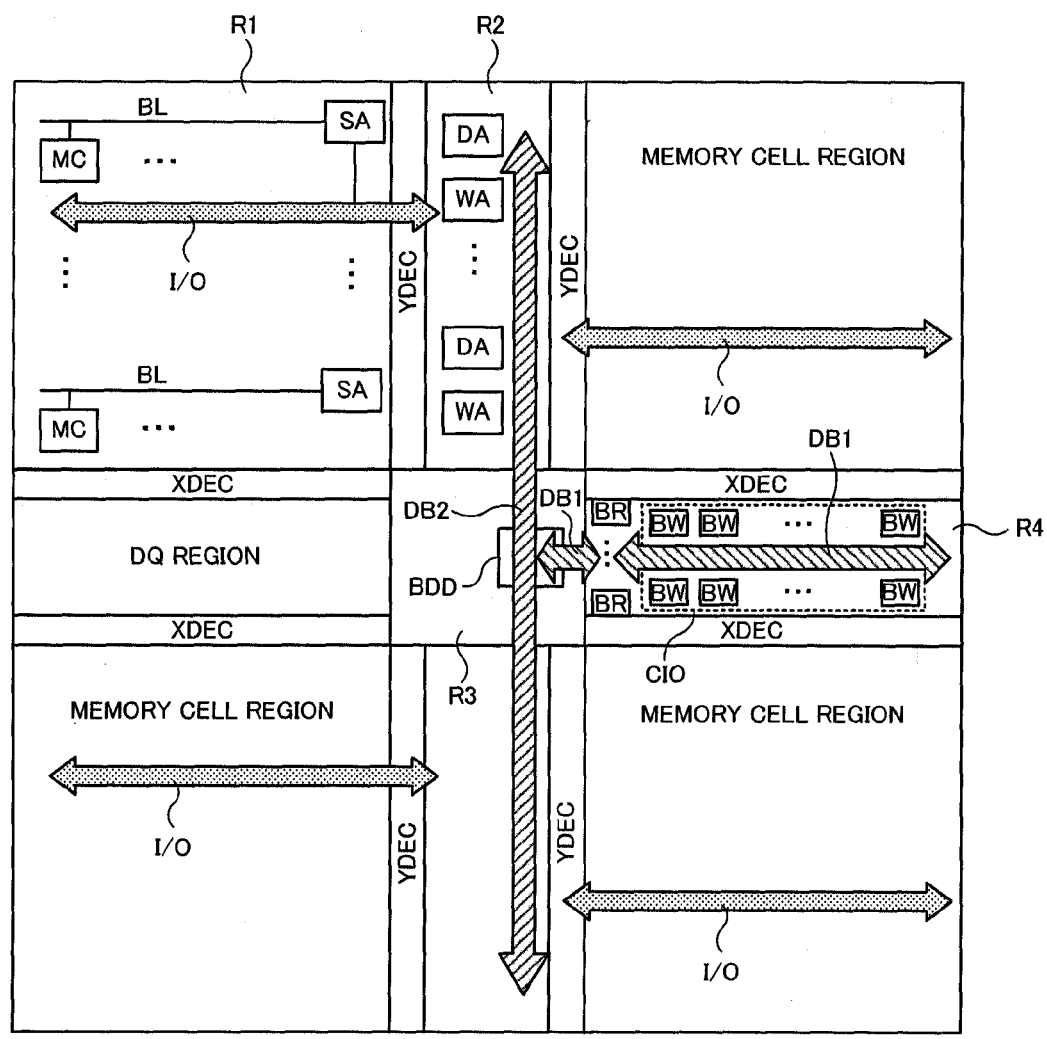
FIG. 1 is a diagram showing an entire configuration of a DRAM of embodiments.
Figure 2:
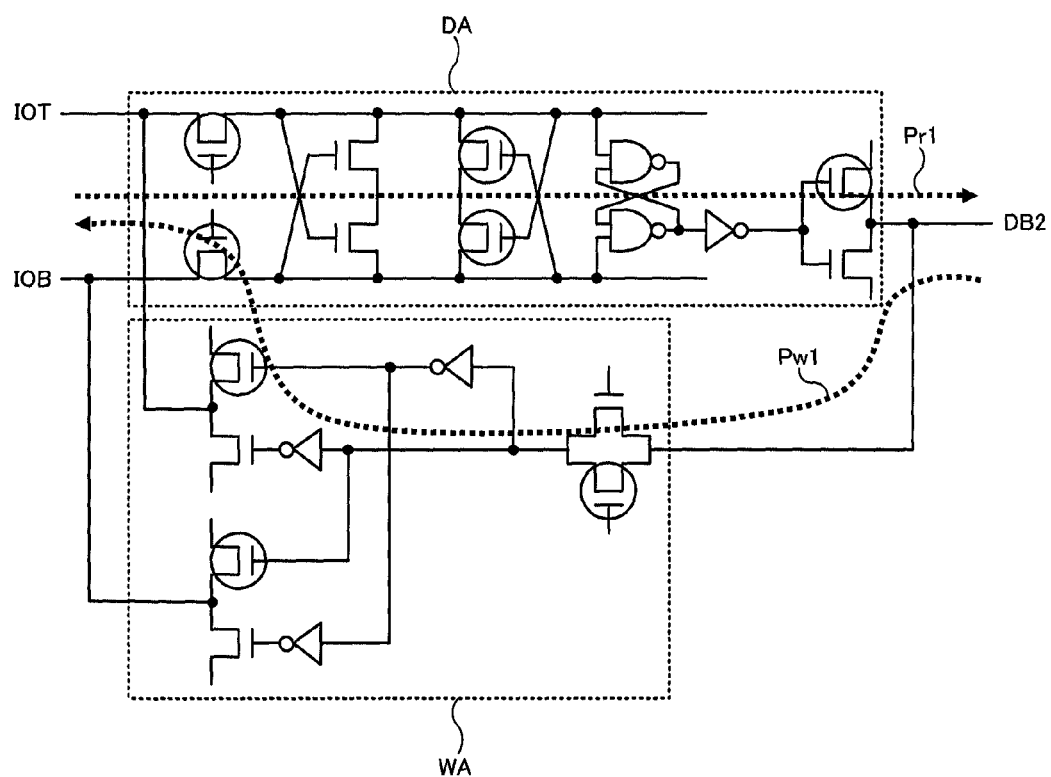
FIG. 2 is a diagram showing an example of a circuit configuration of a data amplifier and a write amplifier in an amplifier region of FIG. 1.
Figure 3:
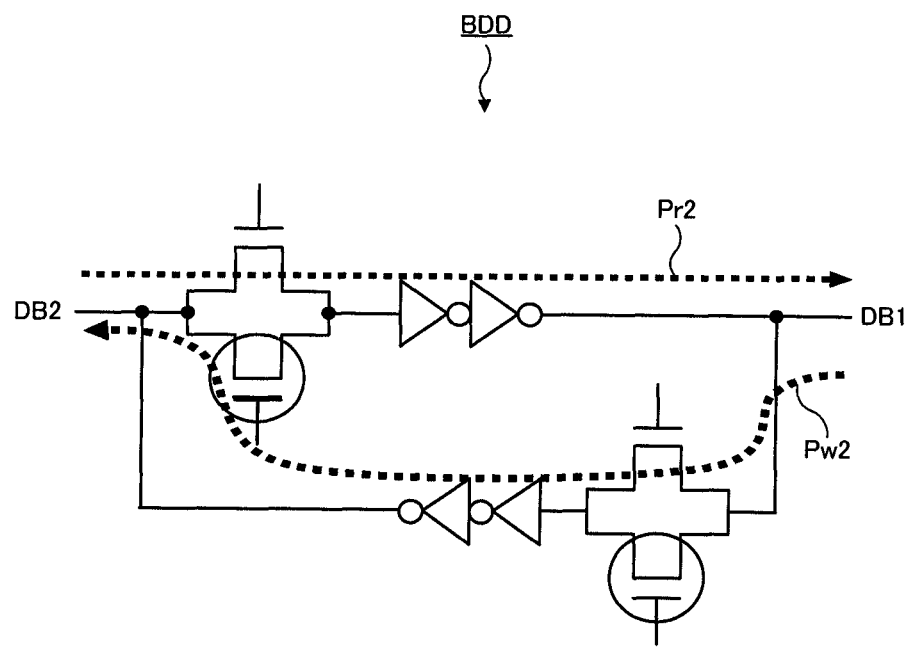
FIG. 3 is a diagram showing an example of a circuit configuration of an inter-bus buffer in a center region of FIG. 1.

FIG. 1 is a block diagram showing an entire configuration of the DRAM of the embodiments. The DRAM shown in FIG. 1 is partitioned into a memory cell region R1, an amplifier region R2, a center region R3, and a DQ region R4. In the memory cell region R1, there are provided a plurality of memory cells MC arranged at intersections of a plurality of word lines (not shown) and a plurality of bit lines BL, a plurality of sense amplifiers SA connected to one ends of the bit lines BL, and a plurality of input/output lines I/O selectively connected to the sense amplifiers SA. In addition, an X decoder XDEC arranged at an end in a word line extending direction and a Y decoder YDEC arranged at an end in a bit line extending direction are attached to the memory cell region R1. In the memory cell region R1, in a read operation of a memory cell MC to be accessed, data stored in the memory cell MC as electric charge is read out to a bit line BL and is amplified by a sense amplifier SA. The read data amplified by the sense amplifier SA is transmitted to an input/output line I/O. Meanwhile, in a write operation of the memory cell MC to be accessed, write data transmitted to the input/output line I/O along a later-mentioned path is written into the memory cell MC through the sense amplifier SA and the bit line BL. In the amplifier region R2, there are provided a plurality of data amplifiers DA and a plurality of write amplifiers WA that are arranged between corresponding input/output lines I/O and a data bus DB2. Each data amplifier DA amplifies read data transmitted through a corresponding input/output line I/O and sends it to the data bus DB2. Each write amplifier WA latches and amplifies write data transmitted through the data bus DB2 and sends it to a corresponding input/output line I/O. FIG. 2 shows an example of a circuit configuration of the data amplifier DA and the write amplifier WA in the amplifier region R2. The data amplifier DA includes a plurality of MOS transistors and logic circuits, and amplifies the read data received as a voltage difference between a pair of lines IOT and IOB included in the input/output line I/O and sends it to a line of the data bus DB2. Further, the write amplifier WA includes a plurality of MOS transistors and a plurality of inverters, and latches and amplifies write data received from a line of the data bus DB2 and outputs it as the voltage difference between the pair of lines IOT and IOB. In FIG. 2, data paths shown by two dotted arrow lines include a path Pr1 and a path Pw1, the read data is transmitted along the path Pr1 in the read operation, and the write data is transmitted along the path Pw1 in the write operation. In addition, notations for various power supplies, ground and control signals that are supplied to circuits are omitted in FIG. 2, and also in following FIGS. 3 and 4. Next, in the center region R3 of FIG. 1, there is provided an inter-bus buffer BDD arranged between the data buses DB1 and DB2. That is, the inter-bus buffer BDD is a bidirectional buffer buffering the read data received from the data bus DB2 to send the data to the data bus DB1 and buffering the write data received from the data bus DB1 to send the data to the data bus DB2. FIG. 3 shows an example of a circuit configuration of the inter-bus buffer BDD in the center region R3. The inter-bus buffer BDD of FIG. 3 includes a plurality of MOS transistors and a plurality of inverters, which latches the read data received from a line of the data bus DB2 to output it to a line of the data bus DB1, and latches the write data received from the line of the data bus DB1 to output it to the line of the data bus DB2. In FIG. 3, data paths shown by two dotted arrow lines include a path Pr2 and a path Pw2, the read data is transmitted along the path Pr2 in the read operation, and the write data is transmitted along the path Pw2 in the write operation. In addition, when configuring each of the data buses DB1 and DB2 using N data lines, N inter-bus buffers BDD in FIG. 3 need to be arranged.

Figure 4:
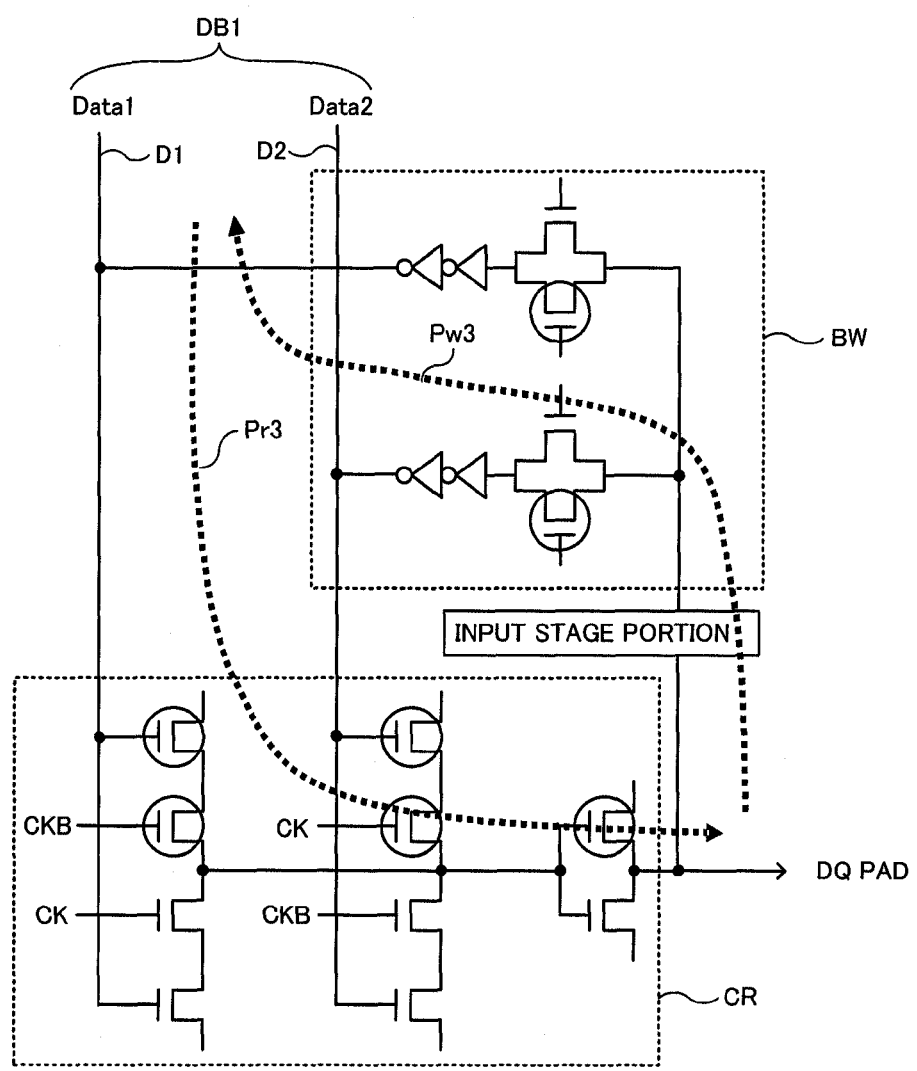
FIG. 4 is a diagram showing an example of a circuit configuration of a unit circuit of an input/output circuit in a DQ region of FIG. 1.

Next, in the DQ region R4 of FIG. 1, there are provided DQ pads (not shown in FIG. 1) for external connection, an input/output circuit CIO disposed between the data bus DB1 and the DQ pads, and a plurality of read buffers BR (the predetermined circuits) arranged in the vicinity of the center region R3. The number of the DQ pads (the plurality of data input/output lines) corresponds to the number of I/O bits of the DRAM. The input/output circuit CIO includes a plurality of write buffers BW arranged near the respective DQ pads, and a plurality of read data transfer circuits CR (FIG. 4) transferring the read data to the DQ pads. The read data transferred from the inter-bus buffer BDD in the center region R3 to the data bus DB1 is transmitted through the read buffers BR, the read data transfer circuits CR of the input/output circuits CIO, and the DQ pads, in this order, and is outputted to outside from the DQ pads. Further, the write data received from outside is transmitted through the DQ pads, the write buffers BW, and the data bus DB1, in this order, and is sent to the inter-bus buffer BDD. FIG. 4 shows an example of a circuit configuration of a unit circuit of the input/output circuit CIO in the DQ region R4. As shown in FIG. 4, the unit circuit of the input/output circuit CIO includes two data lines D1 and D2 of the data bus DB1, and the read data transfer circuit CR and the write buffer BW that are arranged toward a certain one of the DQ pads. The read data transfer circuit CR includes a plurality of MOS transistors, and serially transfers data Data1 and Data2 of 2 bits as the read data received through the data lines D1 and D2 to the DQ pad in synchronization with a clock CK and an inverted clock CKB having a predetermined period. The write buffer BW includes a plurality of MOS transistors and a plurality of inverters, latches the write data received from the DQ pad via an input stage portion so as to branch it into two, and transfers the data as the data Data1 and Data2 that are parallel data of the data lines D1 and D2. In FIG. 4, data paths shown by two dotted arrow lines include a path Pr3 and a path Pw3, the read data is transmitted along the path Pr3 in the read operation, and the write data is transmitted along the path Pw3 in the write operation.

Figure 5:
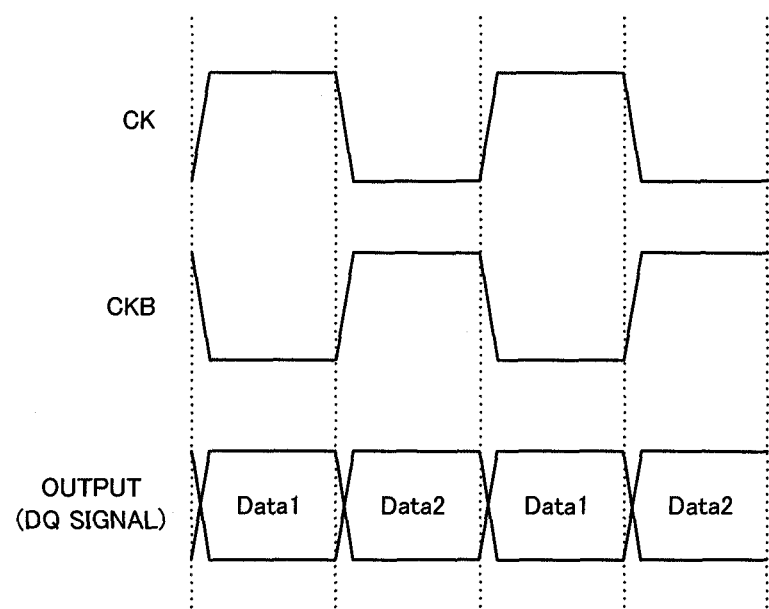
FIG. 5 is a diagram showing an example of operation waveforms in a circuit configuration of FIG. 4 regarding a read operation of the DRAM of the embodiments.

FIG. 5 shows an example of operation waveforms in the circuit configuration of FIG. 4, regarding the read operation of the DRAM of the embodiments. In the read operation, the read data (data Data1 and Data2) from the memory cell MC are amplified by the sense amplifier SA and the data amplifier DA, and thereafter reach the read data transfer circuit CR of FIG. 4 through the data bus DB2, the inter-bus buffer BDD, the data bus DB1 and the read buffer BR. Then, as shown in FIG. 5, the data Data1 and Data2 are alternately outputted from the DQ pad as a DQ signal in synchronization with the above clocks CK/CKB.

Regarding a predetermined number of the DQ pads corresponding to the number of I/O bits, the operation waveforms of FIG. 5 are controlled at common timings. That is, the actual number of I/O bits of the DRAM is set variously to, for example, ×8, ×16, ×32, and the like, and the corresponding number of DQ pads is, 8, 16, 32 and the like. In these cases, a plurality of DQ pads are operated simultaneously in synchronization with common clocks CK/CKB, and therefore data transfer timings in the data bus DB1 need to match one another as to all the DQ pads.

Figure 6:
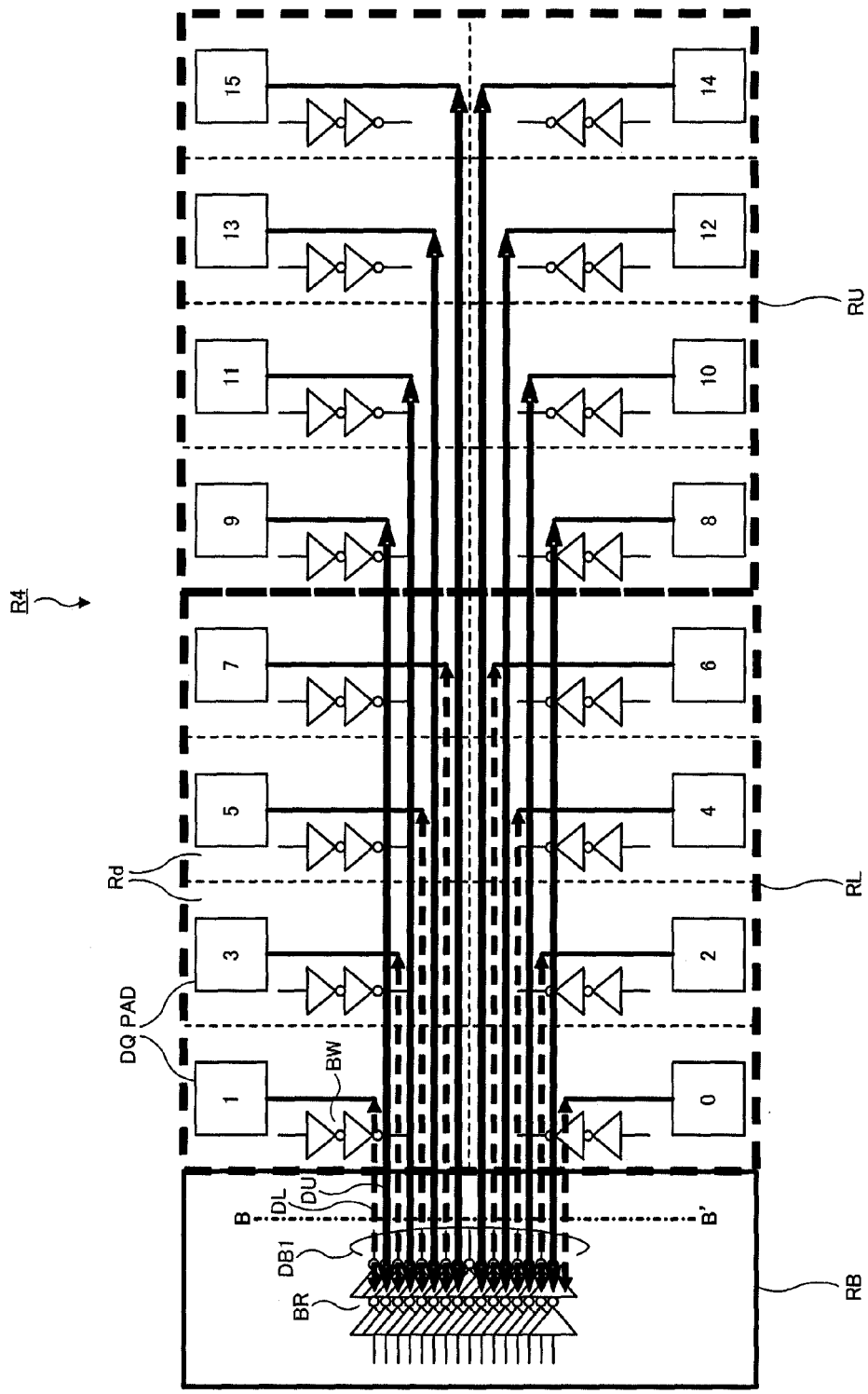
FIG. 6 is a diagram showing a characteristic wiring structure in the DQ region of FIG. 1.

Further, in the example of the input/output circuit CIO of FIG. 4, the read data of 2 bits is transferred in parallel to the input/output circuit CIO through the two data lines D1 and D2, and the data is serially transferred to one DQ pad. However, the number n of bits of parallel transfer can be appropriately set in accordance with specifications of the DRAM. For example, n=2 is set for DDR2 (Double Data Rate 2), and n=4 is set for DDR3 (Double Data Rate 3). In this case, the number of data lines included in the data bus DB1 is obtained by multiplying n and the number of I/O bits. For example, when the number of I/O bits is 16 and n=4, the data bus DB1 needs to be configured using 64 (4×16) data lines in total. Next, FIG. 6 shows a characteristic wiring structure in the DQ region R4 of FIG. 1. In FIG. 6, it is assumed that 16 DQ pads are arranged in the DQ region R4. Then, the 16 DQ pads are divided into two groups, one of which is eight DQ pads 0 to 7 corresponding to lower 8 bits of the data and the other of which is eight DQ pads 8 to 15 corresponding to upper 8 bits of the data. The DQ region R4 is partitioned into a read buffer region RB, a lower DQ region RL, and an upper DQ region RU, from the left side of FIG. 6. Further, each of the lower DQ region RL and the upper DQ region RU is partitioned into eight unit DQ regions Rd (16 unit DQ regions Rd in total) each including one DQ pad. The above-mentioned plurality of read buffers BR are arranged in the read buffer region RB. The lower DQ pads 0 to 7 are arranged in the lower DQ region RL, and the upper DQ pads 8 to 15 are arranged in the upper DQ region RU. The unit circuit (FIG. 4) of the input/output circuit CIO, which includes one write buffer BW, is arranged in each unit DQ region Rd including one DQ pad. In FIG. 6, notations for the circuits are simplified, in which each of the read buffers BR and the write buffers BW is represented by a set of two inverters, and other circuit portions are omitted.

As shown in FIG. 6, the data bus DB1 is represented by 16 data lines extending between the read buffer region RB and the 16 DQ pads. Here, FIG. 6 does not show notations for the parallel transfer for the simplicity. One of features of the wiring layout of the embodiments is that the data lines of the data bus DB1 include eight data lines DU (represented as solid arrow lines) extending into the DQ pads 8 to 15 in the upper DQ region RU that are formed in an upper wiring layer M2 (the second wiring layer) of the DRAM, and eight data lines DL (represented as dashed arrow lines) extending into the DQ pads 0 to 7 in the lower DQ region RL that are formed in a wiring layer M1 (the first wiring layer) under the wiring layer M2. As understood from FIG. 6, each data line DU extending into the upper DQ region RU has a length shorter than that of each data line DL extending into the lower DQ region RL, which becomes approximately half, as viewed from the read buffer region RB.

Figure 7:
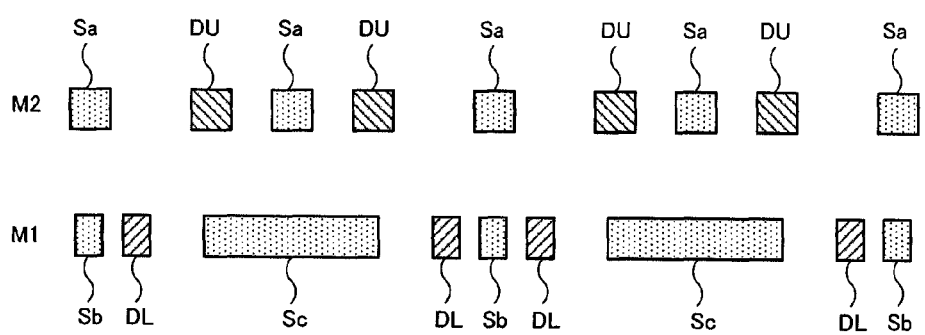
FIG. 7 is a cross-sectional structural view in a read buffer region regarding a data bus of FIG. 6.

FIG. 7 shows a basic cross-sectional structural view of a B-B' section in the read buffer region RB regarding the data bus DB1 of FIG. 6. Not only the data lines of the data bus DB1, but also shield lines for shielding the data lines are formed in the wiring layers M1 and M2 of the DRAM. Specifically, a plurality of data lines DU are arranged in the upper wiring layer M2, and a plurality of data lines DL are arranged in the lower wiring layer M1. Further, a plurality of shield lines Sa are arranged between the respective data lines DU in the upper wiring layer M2, and a plurality of shield lines Sb and Sc are arranged between the respective data lines DL in the lower wiring layer M1. In this manner, since the data lines and the shield lines are alternately arranged in the same wiring layer (M1 or M2), it is possible to reduce coupling between adjacent data lines (DU or DL). Although FIG. 7 corresponds to a basic structure including eight data lines in total, a practical structure of the data bus DB1 needs to be corresponded to the number of the data lines of the data bus DB1. Therefore, the basic structure of FIG. 7 can be applied to the data bus DB1 including a large number of data lines by repeatedly arranging the basic structure. To be exact, a unit structure is obtained by removing a set of shield lines Sa and Sb located at one end from the basic structure of FIG. 7, and the unit structure may be repeatedly arranged. For example, when the number of DQ pads (the number of I/O bits) is 16 and the number n of bits transferred in parallel is 4, 64 (4×16) data lines are required, and eight unit structures may be repeatedly arranged. When attention is focused on a positional relation in a vertical direction of FIG. 7, a shield line Sc with a wide width is formed immediately under every two data lines DU and faces the two lines DU. Then, in the positional relation, each data line DU in the wiring layer M2 faces the lower data line DL in an oblique direction. In the example of FIG. 7, since each data line DL is located obliquely downward (rightward or leftward) relative to the data line DU, it is possible to secure a sufficient gap between a pair of data lines DL and DU in a positional relation of the shortest distance. That is, although data lines facing each other in the vertical direction are not shielded by the shield line, the data lines can be located at a long distance from each other so that the coupling can be correspondingly suppressed.

Figure 18A:
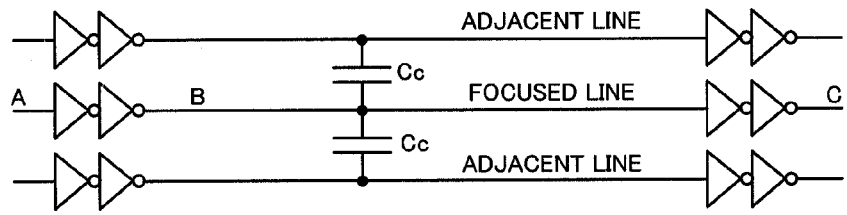
FIGS. 18A and 18B are diagrams explaining a problem caused by high-speed data transfer through a conventional data bus.
Figure 18B:
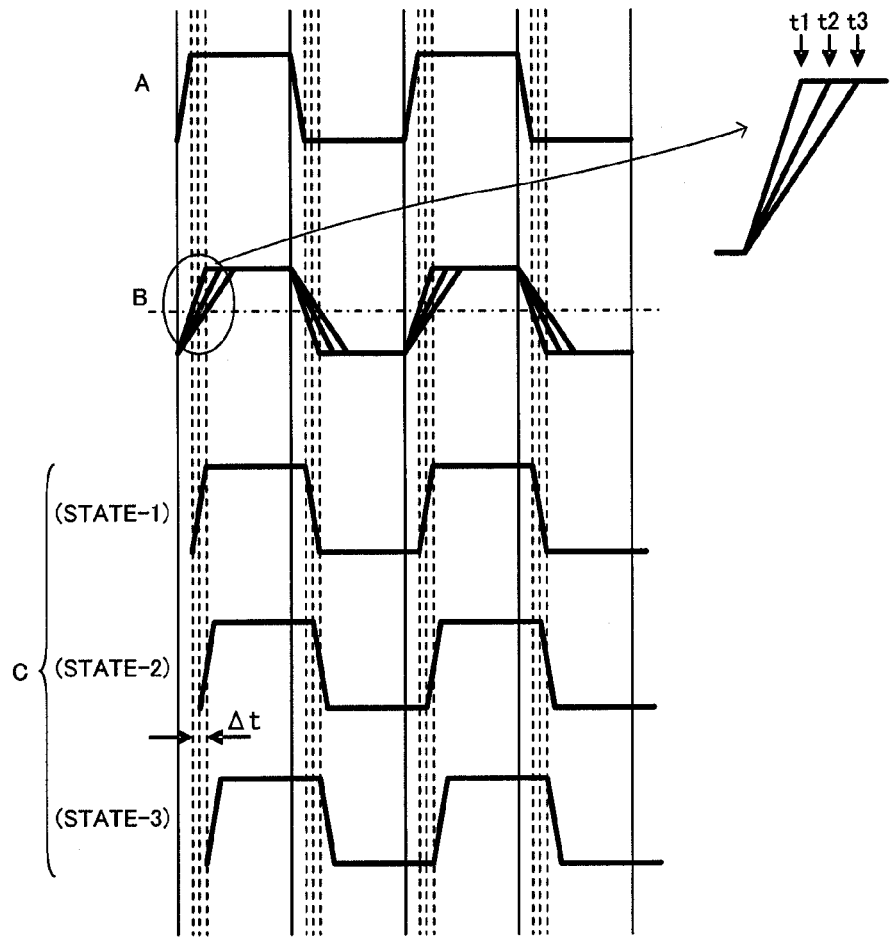
Figure 19:
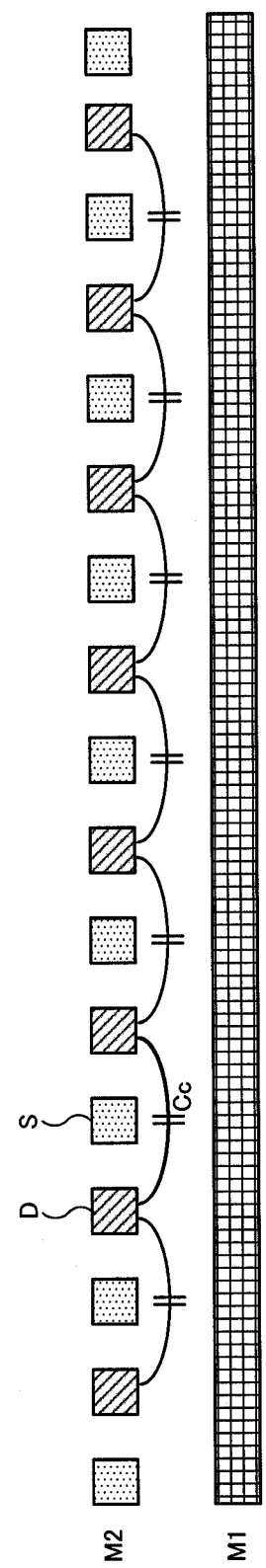
FIG. 19 is a structural diagram explaining a second measure for reducing coupling capacitance between adjacent data lines of the conventional data bus.
Figure 20:
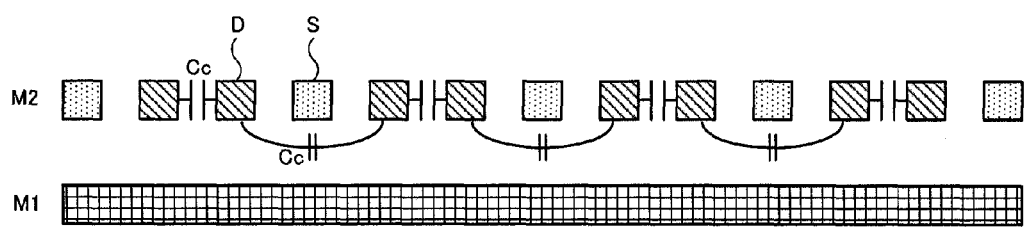
FIG. 20 is a structural diagram explaining a third measure for reducing coupling capacitance between adjacent data lines of the conventional data bus.

If the same number of the data lines and shield lines as those in FIG. 7 are arranged using only one wiring layer, a considerably large area is required. In contrast, since the two wiring layers M1 and M2 are used in the example of FIG. 7, it is possible to reduce size of an layout area (lateral length in FIG. 7). Thus, by employing the wiring layout of the embodiments when configuring the data bus DB1 having the same condition, it is advantageous for reducing chip size. Next, specific design conditions regarding the wiring layout of the embodiments shown in FIGS. 6 and 7 will be described. As described above, the conventional structure of the data bus DB1 causes the above-described problem (see FIGS. 18A and 18B), and it is important to reduce variation in transfer timing between the data lines in order to ensure transmission performance of the data bus DB1. Here, if the data lines DU in the wiring layer M2 and the data lines DL in the wiring layer M1 have the same transmission delay, they have also the same transfer timing. Therefore, it is desirable that a time constant $\tau = CR$ determined by a capacitance C and a resistance R of each of the data lines DU and DL matches one another. Hereinafter, a design condition for matching the time constant $\tau$ of the data lines DU and DL in the wiring layers M2 and M1 will be derived. In FIG. 6, it is possible to regard that a length of each data line DL extending into the lower DQ region RL of the near side in the wiring layer M1 is approximately half that of each data line DU extending into the upper DQ region RU of the far side in the wiring layer M2. For example, when comparing a length La from the read buffer BR to the DQ pads 14 and 15 and a length Lb from the read buffer BR to the DQ pads 6 and 7, a relation of La:Lb=2:1 is approximately satisfied. Under such size condition, assuming that layer resistances of the wiring layers M1 and M2 are the same as each other, a width of the data line DU having the length La may be set to twice a width of the data line DL having the length Lb being half the length La, in order to match the respective resistances R of the data lines DU and DL. That is, both the length and width of the data lines DL in the wiring layer M1 become half those of the data lines DU in the wiring layer M2. Accordingly, the capacitance C of the data line DL becomes smaller than that of the data line DU. Therefore, it is possible to set the gap between the data lines DL in the wiring layer M1 to a small value such that the capacitance C thereof matches that of the data lines DU in the wiring layer M2.

Figure 8:
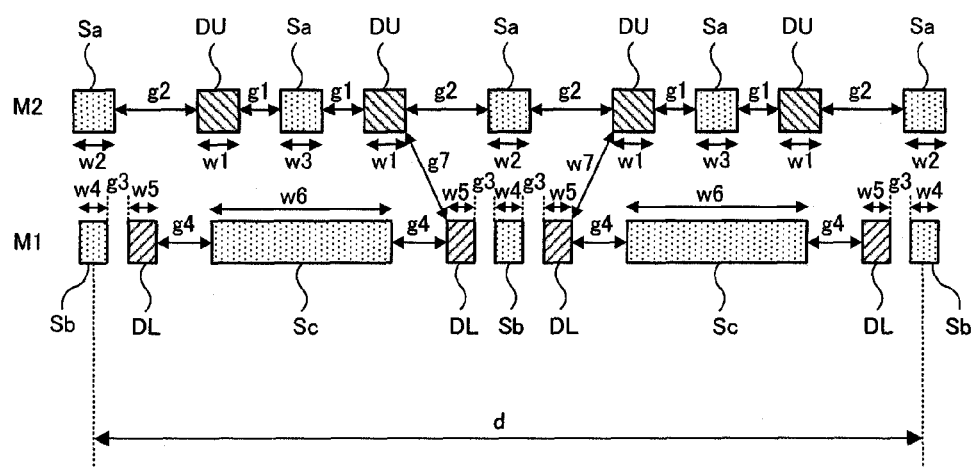
FIG. 8 is a diagram in which widths of data lines and shield lines and gaps between adjacent lines are added to the cross-sectional structural view of FIG. 7.

A setting method of size conditions in the wiring layout of the embodiments will be described below. In FIG. 8, widths w of the data lines and shield lines and gaps g between adjacent lines are added to the cross-sectional structural view of FIG. 7. As shown in FIG. 8, in the wiring layer M2, the data lines DU have a common width w1 and the shield lines Sa have alternately widths w2 and w3. Further, in the wiring layer M1, three shield lines Sb have a width w4, the data lines DL have a common width w5, and two shield lines Sc have a width w6. Meanwhile, in the wiring layer M2, respective adjacent lines are arranged with two kinds of gaps g1 and g2, and in the wiring layer M1, respective adjacent lines are arranged with two kinds of gaps g3 and g4. Further, each pair of data lines DU and DL are arranged with the shortest gap g7 in an oblique direction between the lower and upper wiring layers M1 and M2. In the wiring layer M2, the width w1 and the gaps g1, g2 of the data lines DU are respectively set to values to satisfy transmission characteristics of the data bus DB1, and a relation g1<g2 is satisfied. As described above, based on the design conditions of the time constant $\tau$ and the capacitance C, the width w5 of the data line DL in the wiring layer M1 and the width w1 of the data line DU in the wiring layer M2 are set so that a relation w1>w5 is satisfied. In this case, assuming that the layer resistance of the wiring layer M1 is k times as large as that of the wiring layer M2, $w5 = 0.5 \times w1 \times k$ can be set in consideration of the above described difference in length (La=2×Lb). If the wiring layers M1 and M2 have the same layer resistance (k=1), $w5 = 0.5 \times w1$ is satisfied as described above.

Both the length and width of the data lines DL in the wiring layer M1 are smaller than those of the data lines DU in the wiring layer M2 so that the corresponding capacitance value becomes small, and thus there is room to increase the capacitance value of each data line DL in the wiring layer M1. Therefore, regarding the gaps between the data lines and shield lines, the gaps g3 and g4 in the wiring layer M1 can be set smaller than the gaps g1 and g2 in the wiring layer M2, as shown in FIG. 8. By appropriately setting the gaps g3 and g4, it is possible to adjust the desired capacitance value of each data line DL.

Meanwhile, space is increased by setting the gaps g3 and g4 in the wiring layer M1 to be small, and correspondingly the width w6 of the shield lines Sc can be widened. Thereby, the resistance of the shield lines Sc is sufficiently reduced. Further, a fixed potential, for example, a power source or a ground, may be connected to the shield lines Sc. In this case, the power source or ground may be supplied to the shield lines Sc by connecting them respectively to the shield lines Sa located immediately thereabove through vias. Also, the power source or ground may be supplied to the shield lines Sb by connecting them respectively to the shield lines Sa through the vias.

Further, by setting the widths w2 and w3 of the shield lines Sa in the wiring layer M2 and the width w4 of the shield lines Sb in the wiring layer M1 to be small, and also by setting the gap g1 in the wiring layer M2 and the gap g3 in the wiring layer M1 to be small, the gap g7 between the pair of data lines DU and DL facing each other in the oblique direction between the lower and upper wiring layers M1 and M2 can be set to be large. Thereby, it is possible to reduce the coupling between data lines in the wiring layers M1 and M2. By applying the above-described size conditions to the embodiments, a size d of the layout area of FIG. 8 can be small and the entire layout area can be reduced, as described above.

Figure 9:
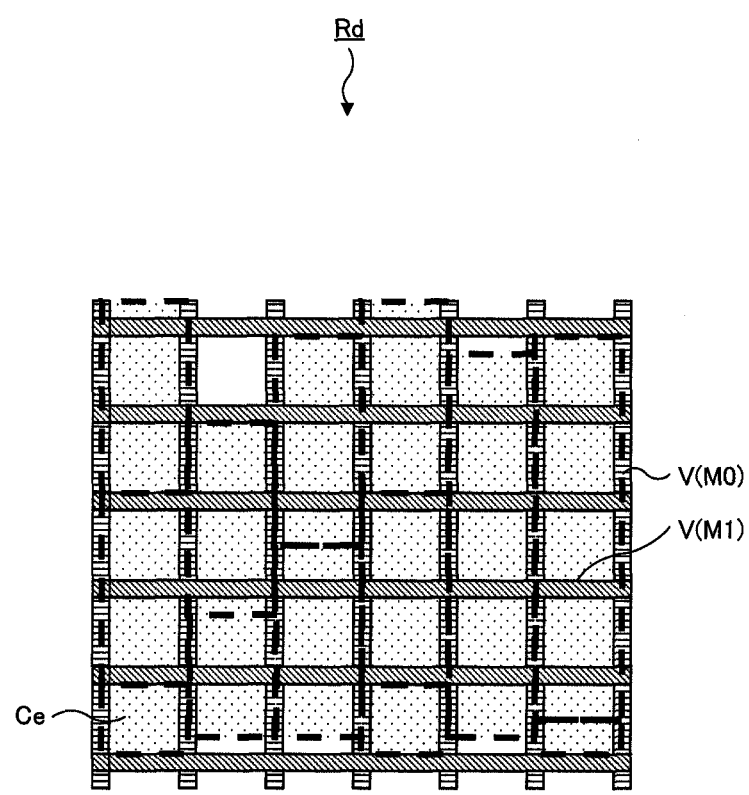
FIG. 9 is a diagram showing a layout of unit DQ regions included in the DQ region of FIG. 6.

Next, a layout of the unit DQ regions Rd included in the DQ region R4 of FIG. 6 will be described with reference to FIG. 9. As described above, in the layout of FIG. 6, the data lines of the data bus DB1 in the wiring layers M2 and M1 extend in a horizontal direction. Then, power supply lines for supplying supply voltages (including the ground) to sources of transistors are formed in a wiring layer M0 under the wiring layers M2 and M1. As shown in FIG. 9, power supply lines V(M0) extend in a longitudinal direction in the wiring layer M0. Since power supply lines V(M1) extend in a lateral direction in the wiring layer M1, the power supply lines V(M0) in the wiring layer M0 and the power supply lines V(M1) in the wiring layer M1 are arranged in a mesh shape, and cells Ce are formed in meshed areas.

Figure 10A:
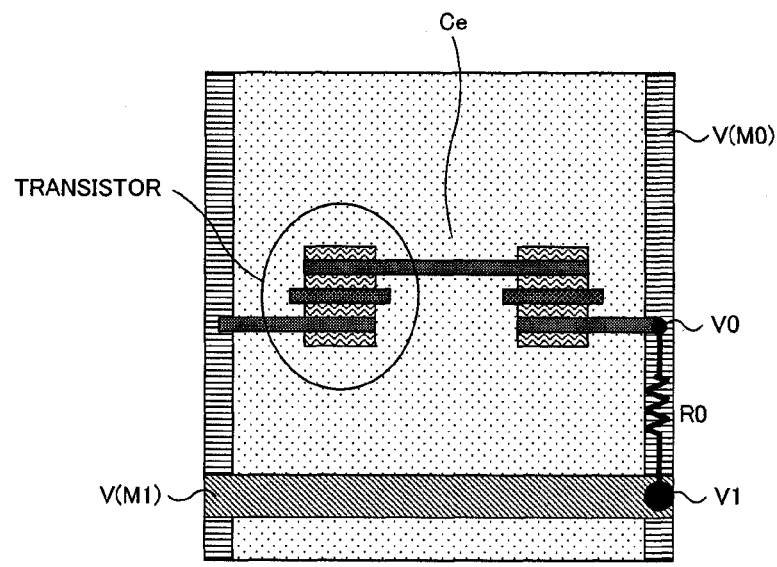
FIGS. 10A and 10B are enlarged diagrams of an area including a cell of FIG. 9.
Figure 10B:
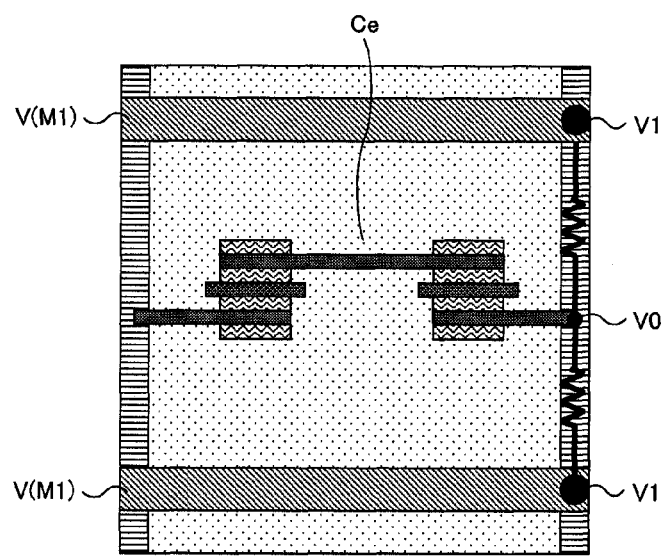

FIGS. 10A and 10B show enlarged diagrams of an area including a cell Ce of FIG. 9. Two transistors are formed on both sides in the cell Ce. Each power supply line V(M0) extending in the longitudinal direction in the wiring layer M0 is connected to a source of the transistor through a via V0. Further, the power supply line V(M0) is connected to the power supply line V(M1) in the wiring layer M1 through a via V1. Here, if a long distance exists between the vias V0 and V1, a partial resistance R0 of the power supply line V(M0) cannot be negligible.

Although only one power supply line V(M1) extending in the lateral direction in the wiring layer M1 is arranged in FIG. 10A, it is desirable to repeatedly arrange the power supply line V(M1) with a predetermined gap in the wiring layer M1 so as to form the mesh shape, as shown in FIG. 10B. Thereby, sources of transistors in the cell Ce can be connected to the power supply lines V(M1) through one via V0 to two vias V1 along two connection paths in both directions, and thus influence of the resistance R0 can be suppressed. In this case, the resistance of FIG. 10B can reduced to R0/2 that is half the resistance R0 of FIG. 10A.

In addition, each shield line Sc (FIG. 7) in the wiring layer M1 having the wide width w6 has a low resistance, and thus is suitable for being used as a line through which the power supply is supplied to the power supply line V(M0) in the wiring layer M0. As described above, by connecting the shield line Sc to the shield line Sa located immediately thereabove through a via so as to set the lines at the same potential, the resistance can be further reduced.

Figure 11:
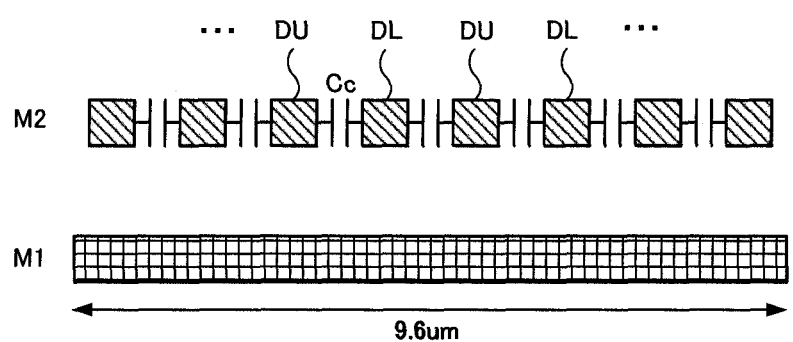
FIG. 11 is a diagram showing a wiring structure of a first comparison example.
Figure 12:
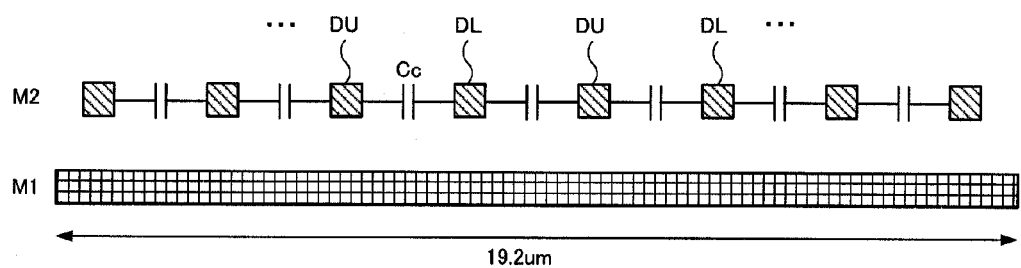
FIG. 12 is a diagram showing a wiring structure of a second comparison example.
Figure 13:
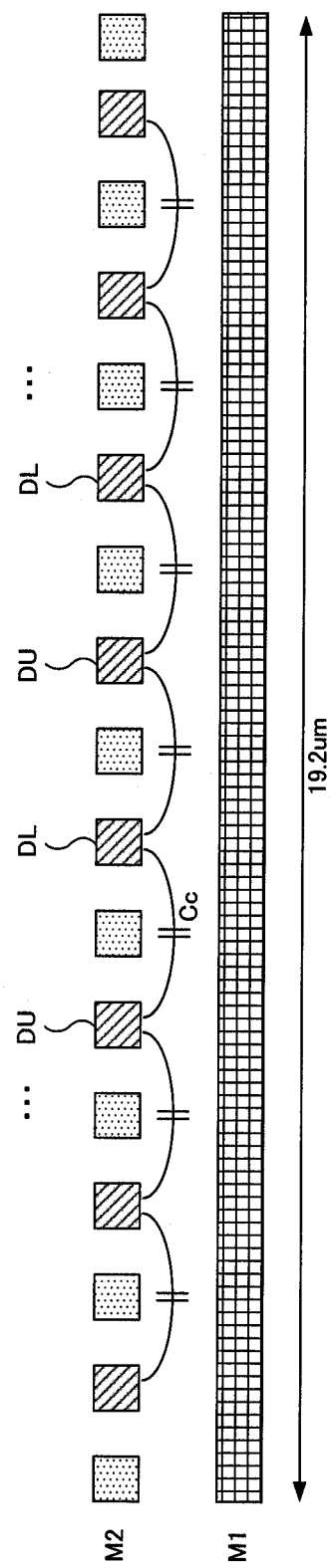
FIG. 13 is a diagram showing a wiring structure of a third comparison example.

Next, simulation results for confirming effects of the wiring structure of the embodiments will be described. FIGS. 11 to 13 show three layout examples as comparison examples that do not employ the wiring structure of the embodiments, which will be compared with the wiring structure of the embodiments below. In the simulations for the layout examples, coupling capacitances of predetermined data lines are obtained under the respective conditions for the respective layout examples for comparison. An evaluation of the coupling capacitance is made by calculating a ratio (%) occupied by the coupling capacitance between the focused and adjacent data lines relative to an entire capacitance of the focused data line. As to the simulation results shown below, the ratio occupied by the coupling capacitance needs to be lower than approximately 10% in order to suppress the influence of the crosstalk between adjacent lines. FIG. 11 shows a wiring structure of a first comparison example. In the first comparison example, data lines are arranged with a constant gap and a constant width in the wiring layer M2, and a line having a wide width is arranged in the wiring layer M1. The data lines include the data lines DU extending into the upper DQ region RU and the data lines DL extending into the lower DQ region RL that are alternately arranged. The size conditions are assumed to include the width w=0.4 μm and the gap g=0.8 μm for the data lines and the size d=9.6 μm for the layout area including eight data lines. Further, the wiring layers M1 and M2 are assumed to be made of aluminum, which will be the same in FIGS. 12 and 13 shown below. The coupling capacitances Cc between the data lines are calculated by simulation for the wiring structure of FIG. 11, and each ratio occupied by the coupling capacitance Cc relative to the data line capacitance is obtained. As a result, the ratio of the coupling capacitance Cc is 12.5% for the data lines DU, and the ratio of the coupling capacitance Cc is 25% for the data lines DL. Thus, for example, when focusing attention on one data line DL sandwiched by the data lines DU on both sides, in consideration of the coupling capacitances Cc on the both sides, the ratio thereof becomes 50% in total. This result is not sufficient as the countermeasure against the crosstalk. In addition, the difference between the results for the data lines DU and DL depends on the difference in length into the lower DQ region RL of the near side and the upper DQ region RU of the far side (approximately 1:2), as described above.

FIG. 12 shows a wiring structure of a second comparison example. The second comparison example is similar in arrangement to the first comparison example, however, size conditions thereof are different. That is, the size conditions include the width w=0.4 μm being the same as in FIG. 11, while the gap g=2 μm is larger than that in FIG. 11. Further, the size d=19.2 μm for the layout area including eight data lines is also larger than that in FIG. 11. The coupling capacitances Cc between the data lines are calculated by simulation for the wiring structure of FIG. 12, and each ratio occupied by the coupling capacitance Cc relative to the data line capacitance is obtained. As a result, the ratio of the coupling capacitance Cc is 5% for the data lines DU, and the ratio of the coupling capacitance Cc is 10% for the data lines DL. Thus, for example, when focusing attention on one data line DL sandwiched by the data lines DU on both sides, in consideration of the coupling capacitances Cc on the both sides, the ratio thereof becomes 20% in total. This result is improved compared to FIG. 11, however, is not sufficient as the countermeasure against the crosstalk, and is disadvantageous for the size of the layout area. FIG. 13 shows a wiring structure of a third comparison example. In the third comparison example, data lines and shied lines are alternately arranged in the wiring layer M2, in which the data lines arranged at every two lines include the data lines DU and the data lines DL that are alternately arranged, as different from the first and second comparison examples. The size conditions include the width w=0.4 μm and the gap g=0.8 μm for the data lines and shield lines, which are the same as in FIG. 11. Meanwhile, the size d=9.6 μm for the layout area including eight data lines and eight shield lines is the same as in FIG. 12. The coupling capacitances Cc between the data lines are calculated by simulation for the wiring structure of FIG. 13, and each ratio occupied by the coupling capacitance Cc relative to the data line capacitance is obtained. As a result, the ratio of the coupling capacitance Cc is lower than 1% for the data lines DU, and the ratio of the coupling capacitance Cc is lower than 1% for the data lines DL. This result is suitable as the countermeasure against the crosstalk, however, is disadvantageous for the size of the layout area.

Next, a layout example employing the wiring structure of the embodiments has the same wiring structure as in FIG. 8. Then, specific size conditions of FIG. 8 are assumed to be w1=w2=w3=0.4 µm, g1=0.48 µm, g2=0.72 µm for the wiring layer M2, and w4=w5=0.28 µm, w6=1.78 µm, g3=0.28 µm, g4=0.34 µm for the wiring layer M1. In addition, the size d of the layout area is set to d=8 µm. For the wiring structure having these size conditions, the coupling capacitances Cc between the data lines are calculated by simulation, and each ratio occupied by the coupling capacitance Cc relative to the data line capacitance is obtained. As a result, the ratio of the coupling capacitance Cc is lower than 1% for the data lines DU in the wiring layer M2, and the ratio of the coupling capacitance Cc is lower than 1% for the data lines DL in the wiring layer M1. Further, regarding the coupling capacitance between the data lines DU and DL facing each other in the oblique direction, the ratio of the coupling capacitance Cc is lower than 8% for the data lines DU in the wiring layer M2, and the ratio of the coupling capacitance Cc is lower than 4% for the data lines DL in the wiring layer M1.

As described above, when employing the wiring structure of the embodiments, the ratio occupied by the coupling capacitance relative to the data line capacitance does not exceed 10% at the maximum. Therefore, it is possible to obtain an effect of suppressing the influence of the crosstalk, and the size of the layout area required in this case can be reduced by about 42% relative to the cases of FIGS. 12 and 13. Accordingly, by employing the wiring structure of the embodiments, it is possible to satisfy both requirements of ensuring excellent transmission performance and preventing an increase in chip size. In the embodiments, examples of the semiconductor device employing the above wiring structure has been specifically described. However, the wiring structure of the embodiments is not limited to the above described structures and can be achieved using various modifications described below.

Figure 14:
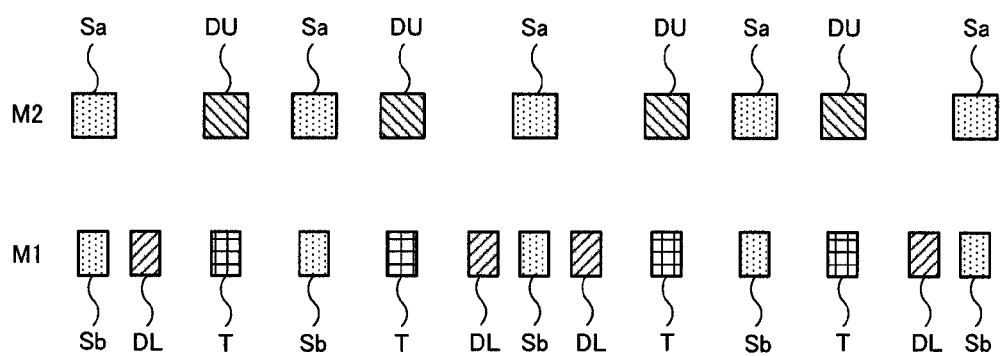
FIG. 14 is a diagram showing a first modification of the wiring structure of the embodiments.

FIG. 14 shows a first modification of the wiring structure of the embodiments. In the first modification, the shield lines Sb with a narrow width and two test signal lines T on both sides thereof are arranged instead of the shield lines Sc with the wide width in the wiring layer M1 in the basic structure of FIG. 7. When the shield lines serve as the power supply lines (lines connected to a fixed potential) and sufficient power supply is supplied from the lower wiring layer M0, for example, the requirement to widen the widths for the purpose of reducing resistances can be small. Therefore, by replacing the shield lines Sc with the shield lines Sb whose width is narrowed, spaces on both sides thereof can be effectively utilized by arranging the test signal lines T that are little affected by potential fluctuation. In addition, since the test signal lines T face the data lines DU located immediately thereabove, lines having large potential fluctuation are not desirable, however, lines used for various purposes other than being used for testing can be arranged.

Figure 15:
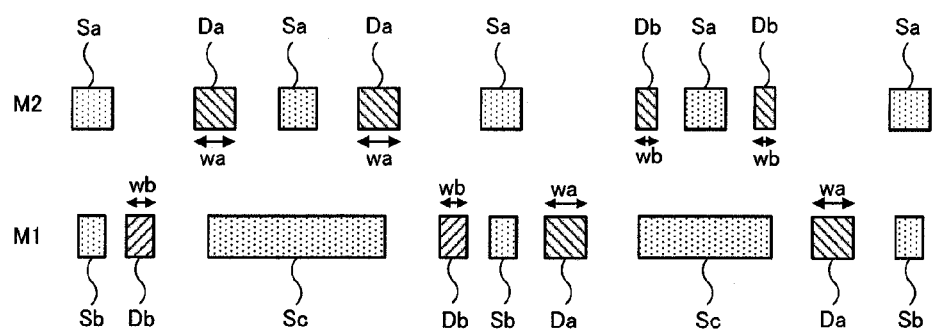
FIG. 15 is a diagram showing a second modification of the wiring structure of the embodiments.

FIG. 15 shows a second modification of the wiring structure of the embodiments. In the second modification, data lines Da with a long length and data lines Db with a short length are mixed and arranged in the respective wiring layers M1 and M2. In this case, a common width wa of the data lines Da is wider than a common width wb of the data lines Db. Meanwhile, gaps between the data lines Da, Db and adjacent shield lines are appropriately set in accordance with resistances, capacitances and the like, and sufficient gaps between data lines facing each other in the oblique direction are set. Further, the shield lines Sa, Sb and Sc are set to have different widths in accordance with the positional relation with the data lines Da and Db facing in a stacking direction. In the second modification, a plurality of data lines Da arranged in both the wiring layers M1 and M2 extend into the upper DQ region RU of the far side, and a plurality of data lines Db arranged in both the wiring layers M1 and M2 extend into the lower DQ region RL of the near side, as different from the basic structure of FIG. 7. Therefore, it is a feature of the second modification that the correspondence relation between the wiring layers M1, M2 and the DQ regions RU, RL are not uniformly determined.

Figure 16:
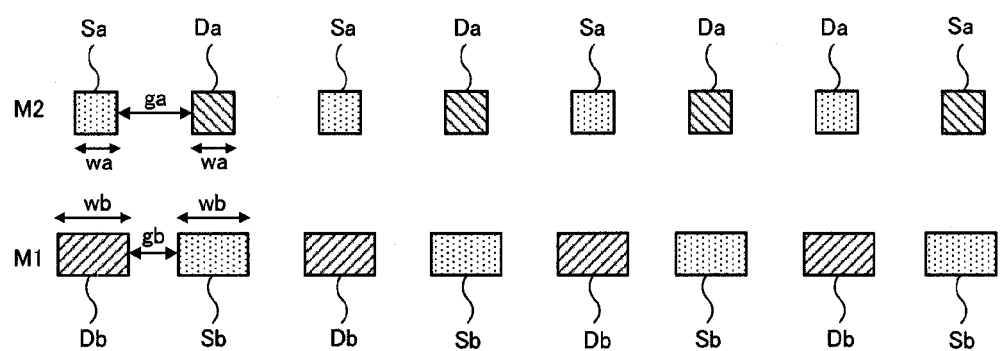
FIG. 16 is a diagram showing a third modification of the wiring structure of the embodiments.
Figure 17:
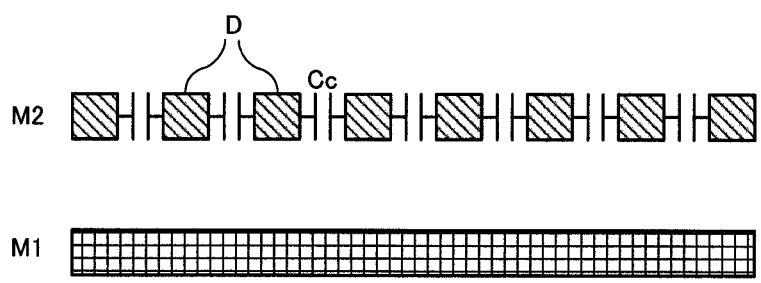
FIG. 17 is a diagram showing a general structural example for arranging a plurality of data lines of a conventional data bus.

FIG. 16 shows a third modification of the wiring structure of the embodiments. In the third modification, the data lines Da in the wiring layer M2 and the data lines Db in the wiring layer M1 have the same length. That is, the arrangement of the data lines Da and Db does not depend on positions of the DQ pads, as different from the basic structure of FIG. 7. As shown in FIG. 16, the common width wa and a common gap ga of the data lines Da and the shield lines Sa in the wiring layer M2 are set to satisfy relations wa<wb and ga>gb relative to the common width wb and a common gap gb of the data lines Db and the shield lines Sb in the wiring layer M1.

For the wiring structure of FIG. 16, each ratio occupied by the coupling capacitance Cc relative to the data line capacitance is obtained by the simulation described in FIGS. 11 to 13. The size conditions at this point are set to wa=0.4 µm, ga=0.8 µm, wb=0.6 µm, gb=0.6 µm, and the simulation is performed. As a result, the ratio of the coupling capacitance Cc is lower than 1% for the data lines Da, the ratio of the coupling capacitance Cc is lower than 1% for the data lines Db, and the ratio of the coupling capacitance Cc between the data liens Da and Db is 4.5%.

In the third modification, the widths wa, wb and the gaps ga and gb of FIG. 16 can be appropriately set in accordance with resistances and capacitances of the data lines or layer resistances of the wiring layers M1 and M2. In this case, relations wa=wb and ga=gb can be set as long as the coupling capacitance Cc can be suppressed. As described above, according to the embodiments of the disclosure, the data bus used for high-speed data transfer in a semiconductor device is formed in two wiring layers, size conditions are appropriately set in accordance with lengths of data lines of the data bus, and it is possible to achieve a wiring structure capable of improving the shielding effect. Thus, the coupling capacitance between the data lines is sufficiently reduced so as to prevent that transmission performance is deteriorated due to influence of the crosstalk, and the data bus can be configured in a small layout area. Accordingly, it is possible to achieve a semiconductor device having the data bus enabling excellent transmission performance without an increase in chip size. In the foregoing, the preferred embodiments have been described. However, the invention is not limited to the above embodiments and can variously be modified without departing the essentials of the invention. For example, FIG. 6 shows the example in which each data line of the data bus DB1 extends from the write buffer BR to each unit DQ region Rd. However, the present invention is not limited to this structure, and can be widely applied to a structure using various data bus transmitting data between a predetermined circuit and a plurality of input/output terminals. Further, the present invention can be applied to a case where circuits such as the memory cells MC, the bit lines BL, the sense amplifiers SA, or the data bus DB2 are not provided. The present invention can be applied to various semiconductor devices, without being limited to DRAM, such as CPU (Central Processing Unit), MCU (Micro Control Unit), DSP (Digital Signal Processor), ASIC (Application Specific Integrated Circuit), ASSP (Application Specific Standard Product) and the like.

The invention claimed is:
1. A semiconductor device comprising:
a multilevel wiring structure over a semiconductor substrate, the multilevel wiring structure comprising first and second wiring layers formed at different levels from each other, and an insulating layer intervening between the first and second wiring layers;
first, second, and third shield lines each formed as the first wiring layer, the first, second, and third shield lines extending in a first direction in parallel to each other, the second shield line being between the first and third shield lines and wider in a second direction that crosses the first direction than each of the first and third shield lines so that the second shield line includes a first portion that extends in the first direction on a side of the first shield line, a third portion that extends in the first direction on a side of the third shield line, and a second portion that extends in the first direction between the first and third portions;
first and second data lines each formed as the first wiring layer, the first data line extending in the first direction between the first shield line and the first portion of the second shield line, and the second data line extending in the first direction between the third shield line and the third portion of the second shield line;
fourth, fifth, and sixth shield lines each formed as the second wiring layer, the fourth shield line extending in the first direction while vertically overlapping the first shield line, the fifth shield line extending in the first direction while vertically overlapping the second portion of the second shield line, and the sixth shield line extending in the first direction while vertically overlapping the third shield line; and
third and fourth data lines formed as the second wiring layer, the third data line being between the fourth and fifth shield lines and extending in the first direction while vertically overlapping the first portion of the second shield line, the fourth data line being between the fifth and sixth shield lines and extending in the first direction while vertically overlapping the third portion of the second shield line, and each of the third and fourth data lines being longer in the first direction than each of the first and second data lines and larger in cross-sectional area than each of the first and second data lines.

2. The device as claimed in claim 1, wherein the third data line does not vertically overlap the first data line, and the fourth data line does not vertically overlap the second data line.

3. The device as claimed in claim 1, wherein each of the third and fourth data lines is wider in the second direction than each of the first and second data lines.

4. The device as claimed in claim 1, wherein the second shield line is wider in the second direction than each of the fourth, fifth, and sixth shield lines.

5. The device as claimed in claim 4, wherein each of the fourth, fifth, and sixth shield lines is wider in the second direction than each of the first and third shield lines.

6. The device as claimed in claim 2, a first gap between the fourth shield line and the third data line is larger than a second gap between fifth shield line and the third data line, and a third gap between the fifth shield line and the fourth data line is larger than a fourth gap between the sixth shield line and the fourth data line.

7. The device as claimed in claim 6, wherein a fifth gap between the first data line and the first portion of the second shield line is larger than a sixth gap between the first data line and the first shield line, and a seventh gap between the second data line and the third portion of the second shield line is larger than an eighth gap between the second data line and third shield line.

8. The device as claimed in claim 1, wherein the first wiring layer is between the second wiring layer and the semiconductor substrate.

9. The device as claimed in claim 1, wherein the second wiring layer is between the first wiring layer and the semiconductor substrate.

10. The device as claimed in claim 1, further comprising a first via selectively formed in the insulating layer to connect the first and fourth shield lines to each other, a second via selectively formed in the insulating layer to connect the second and fifth shield lines to each other and a third via selectively formed in the insulating layer to connect the third and sixth shield lines to each other.

11. A semiconductor device comprising:
a multilevel wiring structure over a semiconductor substrate, the multilevel wiring structure comprising first and second wiring layers formed at different levels from each other, and an insulating layer intervening between the first and second wiring layers;
a first bus extending in a first direction; and
a second bus arranged in a second direction that crosses the first direction and extending in the first direction in parallel to the first bus,
wherein each of the first and second buses comprises:
first, second, and third shield lines each formed as the first wiring layer, the first, second, and third shield lines extending in the first direction in parallel to each other, the second shield line being between the first and third shield lines and wider in the second direction than each of the first and third shield lines so that the second shield line includes a first portion that extends in the first direction on a side of the first shield line, a third portion that extends in the first direction on a side of the third shield line and a second portion that extends in the first direction between the first and third portions,
first and second data lines each formed as the first wiring layer, the first data line extending in the first direction between the first shield line and the first portion of the second shield line, and the second data line extending in the first direction between the third shield line and the third portion of the second shield line,
fourth, fifth, and sixth shield lines each formed as the second wiring layer, the fourth shield line extending in the first direction while vertically overlapping the first shield line, the fifth shield line extending in the first direction while vertically overlapping the second portion of the second shield line, and the sixth shield line extending in the first direction while vertically overlapping the third shield line, and
third and fourth data lines each formed as the second wiring layer, the third data line being between the fourth and fifth shield lines and extending in the first direction while vertically overlapping the first portion of the second shield line, the fourth data line being between the fifth and sixth shield lines and extending in the first direction while vertically overlapping the third portion of the second shield line, and each of the third and fourth data lines being longer in the first direction than each of the first and second data lines and larger in cross sectional area than each of the first and second data lines, and wherein the third shield line of the first bus and the first shield line of the second bus are used in common to each other, and the sixth shield line of the first bus and the fourth shield line of the second bus are used in common to each other.

12. The device as claimed in claim 11, wherein the third data line does not vertically overlap the first data line and the fourth data line does not vertically overlap the second data line.

13. The device as claimed in claim 12, wherein the first wiring layer is between the second wiring layer and the semiconductor substrate.

14. The device as claimed in claim 12, wherein the second wiring layer is between the first wiring layer and the semiconductor substrate.

15. The device as claimed in claim 12, further comprising a first via selectively formed in the insulating layer to connect the first and fourth shield lines to each other, a second via selectively formed in the insulating layer to connect the second and fifth shield lines to each other and a third via selectively formed in the insulating layer to connect the third and sixth shield lines to each other.

* * * * *